US009112119B2

(12) United States Patent
Xu et al.

(10) Patent No.: US 9,112,119 B2
(45) Date of Patent: Aug. 18, 2015

(54) OPTICALLY EFFICIENT SOLID-STATE LIGHTING DEVICE PACKAGING

(71) Applicant: Axlen, Inc., Wilmington, DE (US)

(72) Inventors: Li Xu, Saratoga, CA (US); Bo Pi, Carlsbad, CA (US)

(73) Assignee: Axlen, Inc., Wilmington, DE (US)

( * ) Notice: Subject to any disclaimer, the term of this patent is extended or adjusted under 35 U.S.C. 154(b) by 278 days.

(21) Appl. No.: 13/857,076

(22) Filed: Apr. 4, 2013

(65) Prior Publication Data

US 2013/0264946 A1 Oct. 10, 2013

Related U.S. Application Data

(60) Provisional application No. 61/620,402, filed on Apr. 4, 2012.

(51) Int. Cl.
| | |
|---|---|
| *H05B 37/02* | (2006.01) |
| *H05B 39/04* | (2006.01) |
| *H05B 41/36* | (2006.01) |
| *H01L 33/50* | (2010.01) |
| *H01L 33/64* | (2010.01) |
| *H05B 33/08* | (2006.01) |

(Continued)

(52) U.S. Cl.
CPC ............ *H01L 33/50* (2013.01); *H01L 25/0753* (2013.01); *H01L 33/64* (2013.01); *H05B 33/0842* (2013.01); *H01L 33/504* (2013.01); *H01L 33/507* (2013.01); *H01L 33/60* (2013.01); *H01L 2224/48091* (2013.01)

(58) Field of Classification Search
USPC .................................................. 315/149, 151
See application file for complete search history.

(56) References Cited

U.S. PATENT DOCUMENTS

| | | | | |
|---|---|---|---|---|
| 2007/0047254 | A1* | 3/2007 | Schardt et al. | 362/607 |
| 2007/0047261 | A1* | 3/2007 | Thompson et al. | 362/623 |
| 2007/0256453 | A1* | 11/2007 | Barnes et al. | 65/17.3 |

(Continued)

FOREIGN PATENT DOCUMENTS

| | | |
|---|---|---|
| JP | 2007173408 | 7/2007 |
| JP | 2007294834 | 11/2007 |

(Continued)

OTHER PUBLICATIONS

Park, Hye Lyun, Authorized Officer, Korean Intellectual Property Office, International Search Report for PCT/US2013/035334, dated Jul. 26, 2013, 14 pages.

*Primary Examiner* — Adam Houston
(74) *Attorney, Agent, or Firm* — Perkins Coie LLP

(57) ABSTRACT

Methods, systems, and devices are disclosed for light-emitting diode and laser diode packaging designs. In one aspect, an LED lighting device includes a substrate capable of dissipating heat, the substrate formed of a metal or ceramic material, an array of LED dies located on the substrate, electrically conductive lines on the substrate and electrically connected to the LED dies for electrically driving the LED dies to emit light, a grid structure over the substrate forming an array of cavities to surround the LED dies in respective cavities, an optically reflective coating at least partially covering one or more of exposed regions of the substrate, the electrically conductive lines, or surfaces of the grid structure, and optically transparent plates placed over at least some of the cavities of the grid structure allowing transmission of light produced by a respective LED die inside a respective cavity.

45 Claims, 5 Drawing Sheets

(51) Int. Cl.
  *H01L 25/075* (2006.01)
  *H01L 33/60* (2010.01)

(56) References Cited

U.S. PATENT DOCUMENTS

| | | | |
|---|---|---|---|
| 2010/0133560 A1* | 6/2010 | Kim et al. | 257/89 |
| 2010/0295070 A1 | 11/2010 | Su et al. | |
| 2011/0044022 A1 | 2/2011 | Ko et al. | |
| 2011/0115406 A1 | 5/2011 | Wang et al. | |
| 2011/0116284 A1* | 5/2011 | Richardson | 362/555 |
| 2012/0007076 A1* | 1/2012 | Cho | 257/48 |
| 2012/0235581 A1* | 9/2012 | Chou | 315/185 R |
| 2013/0264577 A1* | 10/2013 | Xu et al. | 257/76 |
| 2013/0264946 A1* | 10/2013 | Xu et al. | 315/151 |
| 2014/0264406 A1* | 9/2014 | Muehlbacher et al. | 257/89 |

FOREIGN PATENT DOCUMENTS

| | | |
|---|---|---|
| JP | 2010182724 | 8/2010 |
| WO | 2011163672 | 12/2011 |

* cited by examiner

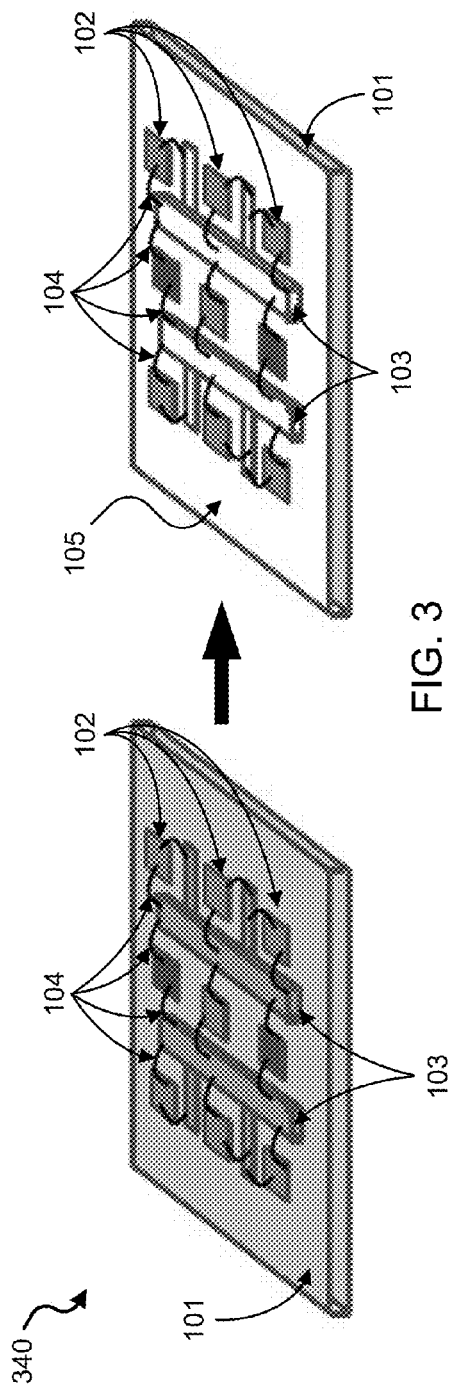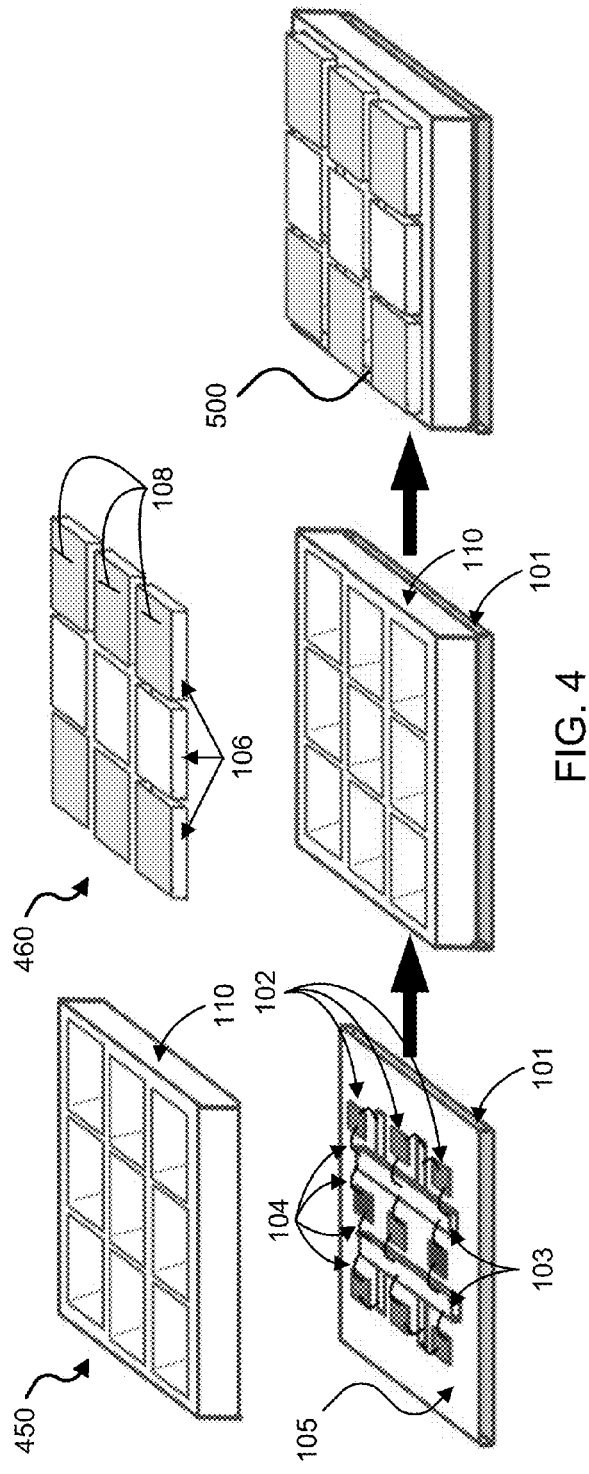
FIG. 3
FIG. 4

OPTICALLY EFFICIENT SOLID-STATE LIGHTING DEVICE PACKAGING

PRIORITY CLAIM

This patent document claims the priority of U.S. provisional application No. 61/620,402 entitled "OPTICALLY EFFICIENT SOLID-STATE LIGHTING DEVICE PACKAGING" filed on Apr. 4, 2012, the entire disclosure of which is incorporated herein by reference for all purposes.

TECHNICAL FIELD

This patent document relates to systems, devices, and processes for using light-emitting diodes in lighting devices or lighting fixtures.

BACKGROUND

A light-emitting diode (LED) is a semiconductor light source. An LED includes semiconducting materials doped with impurities to create a p-n junction, in which electrical current can easily flow one directionally from the p-side (anode) to the n-side (cathode), but not in the reverse direction. Charge-carriers (e.g., electrons and holes) flow into the p-n junction from connecting electrodes at each end of the junction having different voltages. For example, when an electron combines with a hole, the electron falls into a lower energy level and can release energy in the form of a photon, e.g., emitting light. This effect is referred to as electroluminescence. The wavelength of the light emitted, and thus the color of the emitted light, depends on the band gap energy of the materials forming the p-n junction. For example, bright blue LEDs are based on the wide band gap semiconductors including GaN (gallium nitride) and InGaN (indium gallium nitride). For producing white light using LEDs, one technique is to use individual LEDs that emit three primary colors (red, green, and blue) and then mix all the colors to form white light. Another technique is to use a phosphor material to convert monochromatic light from a blue or ultraviolet LED to broad-spectrum white light, e.g., in a similar manner to fluorescent light bulbs.

A laser diode (LD) is an electrically-pumped semiconductor laser light source. In an LD, the active medium is a solid state semiconductor formed by a p-n junction, e.g., similar to that found in an LED, rather than a gas medium (e.g., in conventional lasing). Laser diodes form a subset of semiconductor p-n junction diodes. For example, a forward electrical bias across the p-n junction of the LD causes the charge carriers to be injected from opposite sides of the p-n junction into the depletion or junction region, e.g., holes are injected from the p-doped component and electrons are injected from the n-doped component of the semiconductor material. As electrons are injected into the diode, the charge carriers combine, some of their excess energy is converted into photons, which interact with more incoming electrons, thereby producing more photons in a self-perpetuating analogous to the process of stimulated emission that occurs in a conventional, gas-based laser. Some examples of conventional LDs include 405 nm InGaN blue-violet laser diodes, e.g., used in in Blu-ray Disc and high definition DVD drive technologies, and 785 nm GaAlAs (gallium aluminum arsenide) laser diodes, e.g., used in Compact Disc (CD) drives.

SUMMARY

Disclosed are techniques, systems, and devices that include LED/LD chip packaging designs including used to construct solid-state lighting devices and systems with high optical output efficiency and good color quality and accuracy.

In one aspect, an LED lighting device includes a substrate capable of dissipating heat, the substrate formed of a metal or ceramic material, an array of LED dies located on the substrate, electrically conductive lines on the substrate and electrically connected to the LED dies for electrically driving the LED dies to emit light, a grid structure over the substrate, the grid structure including top openings and bottom openings and forming an array of cavities to surround the LED dies in respective cavities, an optically reflective coating at least partially covering one or more of exposed regions of the substrate, the electrically conductive lines, or surfaces of the grid structure, in which light emitting regions of the LED dies are not covered by the optically reflective coating, and optically transparent plates placed over at least some of the top openings of the grid structure, in which one optically transparent plate corresponds to one cavity, the optically transparent plates allowing transmission of light produced by a respective LED die inside a respective cavity.

In another aspect, an LED lighting device includes a heat sink plate formed of a metal or ceramic material, LED dies formed on and in direct contact with the heat sink plate, electrically conductive lines formed between the LED dies, the electrically conductive lines being connected to the LED dies via wire bonding for electrically driving the LED dies to emit light, an array of cavities formed over the heat sink plate to enclose the LED dies in respective cavities, one LED die per cavity, an optically reflective coating formed over the electrically conductive lines, exposed areas of the heat sink plate, and surfaces of the cavities while leaving LED dies free of the optically reflective coating, optically transparent plates formed over the LED dies, respectively, and each optically transparent plate placed on a top opening of a respective cavity to be spaced from the LED dies and to allow transmission of light produced by a respective LED die inside the cavity, an optically transparent material filled in the cavities underneath the optically transparent plates and having a refractive index that is close to or matches a refractive index of the optically transparent plates, and phosphor layers formed on at least some of the optically transparent plates to convert light from respective LED dies into light of desired colors.

In another aspect, a method to fabricate light-emitting diode (LED) lighting device includes forming LED dies directly over a substrate capable of dissipating heat, forming electrically conductive lines on the substrate electrically connected to the LED dies, the electrically conductive lines operable for electrically driving the LED dies to emit light, forming an optically reflective coating to at least partially cover one or more of exposed regions of the substrate or the electrically conductive lines, in which light emitting regions of the LED dies are not covered by the optically reflective coating, attaching a grid structure over the substrate to form an array of cavities corresponding to the array of LED dies, in which the grid structure includes surfaces coated with the optically reflective coating, and attaching optically transparent plates over at least some of the cavities of the grid structure, in which one optically transparent plate corresponds to one cavity, the optically transparent plates allowing transmission of light produced by a respective LED die inside a respective cavity.

The subject matter described in this patent document can be implemented in specific ways that provide one or more of the following features. For example, the disclosed chip packaging technology can be used for LED chips with multi-color LED dies to allow adjustment of colors and optical power of the output light. The described LED/LD chip packaging technology can provide better heat dissipation (e.g., lower thermal resistance) by placing LED/LD chips and/or dies directly on a metal heat sink substrate. The disclosed LED/LD chip packaging technology require less packaging materials compared to conventional designs, e.g., no Metal Core Printed Circuit Boards (MCPCBs) and/or no lead-frame. The disclosed LED/LD chip packaging technology include optically transparent plates that can include phosphors to provide higher conversion efficiency (e.g., white lumen/blue output) and increased light output. This exemplary feature can also provide better color control, e.g., due to precision control of the phosphors on the plates, which minimizes or eliminates color spread from occurring in such lighting devices including the disclosed LED/LD packaging designs.

BRIEF DESCRIPTION OF DRAWINGS

FIGS. 3 and 4 show exemplary additional processing steps subsequent to the processing steps in FIG. 2.

Like reference symbols and designations in the various drawings indicate like elements.

DETAILED DESCRIPTION

Lighting devices can be constructed by using light-emitting elements arranged in an array where each light-emitting element or groups of light-emitting elements are controlled to emit light. Each light-emitting element can be a light-emitting diode (LED) or a laser diode (LD).

High power LED engines or lighting devices that produce white light have wide applications for LED-based lighting applications with high power efficiency, e.g., such as replacing incandescent lamps or halogen lamps in various lighting devices or systems. Multiple LED chips or dies can be combined together to produce desired high power levels, e.g., output optical power greater than 3 W. In some LED lighting devices, multiple blue LED chips, e.g., several high power blue LED chips to a large number of low power blue LED chips, can be packed together to optically excite phosphor materials to produce light of different colors which are then combined to produce the final white light output. For example, in various conventional LED lighting device designs, phosphors, which may be mixed with silicone in some implementations, are directly deposited over the LED chips to convert the blue light from the LED chips into white light as the output. The direct contact between the phosphors and LED chips exposes the phosphors to a heated condition due to heat generated at the LED chips and thus causes undesired poor phosphor performance. In addition, the amounts and spatial uniformity of the phosphors deposited over the LED chips are difficult to control in such LED packaging designs. These and other factors lead to poor color quality and color accuracy represented by a color rendering index (CRI), color variations of different lamps, and relatively low light conversion from the LED blue light to the desired white output light.

Disclosed are techniques, systems, and devices that include LED/LD packaging designs including structures that enable high optical conversion efficiency and good color quality and accuracy.

Figure 1:
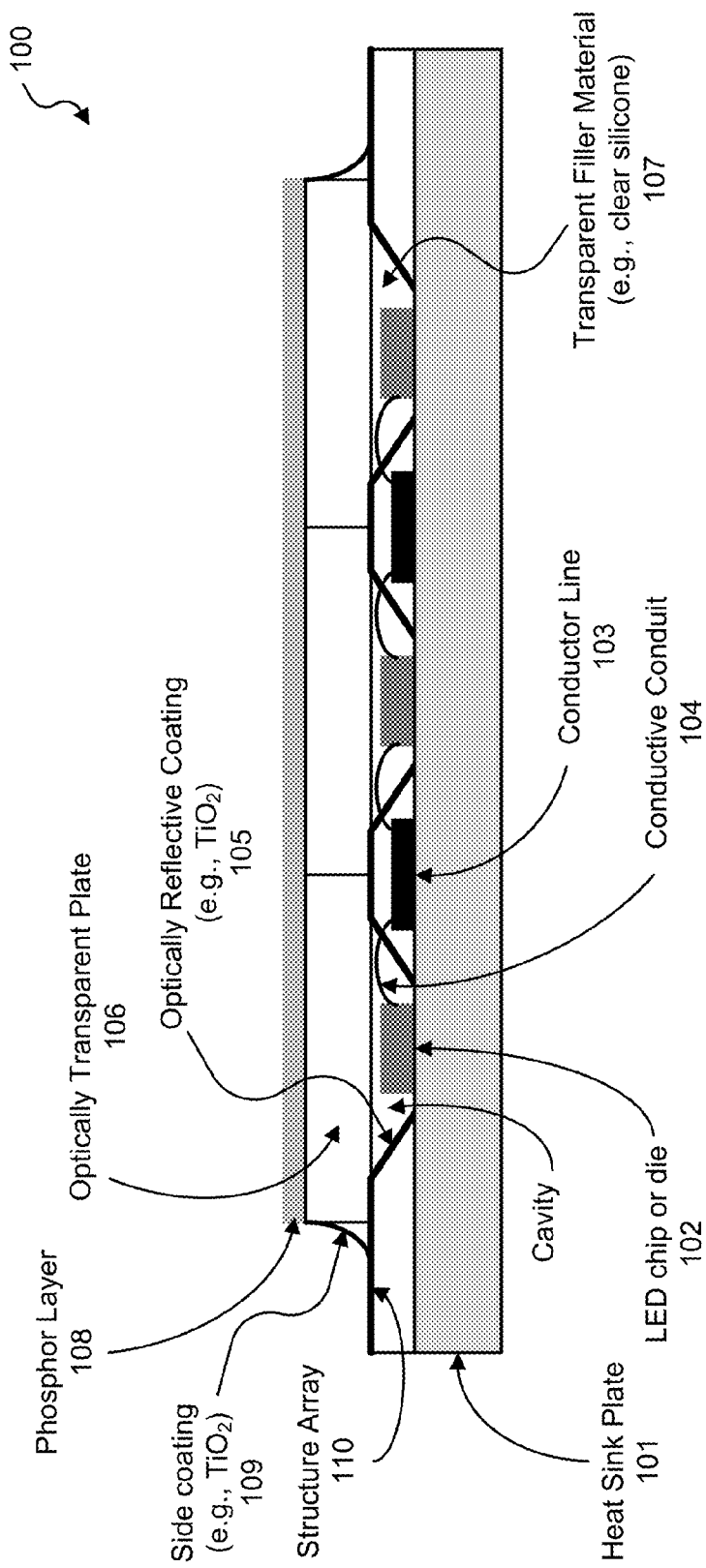
FIG. 1 shows an LED lighting device based on an exemplary multi-LED chip package design of the disclosed technology.

FIG. 1 shows an LED lighting device 100 based on an exemplary multi-LED chip package design of the disclosed technology that places each LED in an optically reflective cavity to produce high optical output and a phosphor layer that is detached from the surface of the LED chip for improved performance. In this example, the LED lighting device 100 includes a heat sink plate 101 which can be formed of a metal or ceramic material. For example, the heat sink plate 101 can be configured as a copper plate. The LED lighting device 100 includes one or more LED chips and/or dies 102 formed on and in direct contact with the underlying heat sink plate 101. The LED lighting device 100 includes electrically conductive lines or strips 103 that are formed between the LED chips and/or dies 102 and connected to the LED chips and/or dies 102 by an electrically conductive conduit 104. For example, the electrically conductive conduit 104 can be formed via wire bonding.

For example, the LED chips and/or dies 102 can be organized in an array on the heat sink plate 101, in which each LED chip or die component is arranged at a particular distance apart from a neighboring LED in the array. In one example, the LEDs 102 can be spaced uniformly apart in a two dimensional arrangement or a one dimensional line on the heat sink plate 101. In another exemplary configuration, the LEDs 102 can be arranged nonuniformly on the heat sink plate 101. For example, an exemplary nonuniform arrangement can include different groupings of LEDs (e.g., in subgroups) that have a particular spacing between the subgroups that is not equivalent to the spacing between the LEDs within each subgroup.

In some exemplary implementations including the array of LED dies, the LED dies 102 can be structured to include a sapphire substrate that can be formed in direct contact with the underlying heat sink plate 101. In this example, the LED lighting device 100 includes a grid structure 110, which is formed over the heat sink plate 101, forming an array of cavities that surround each of the LED dies 102 of the corresponding array of LED dies, e.g., one LED die per cavity as shown in FIG. 1. In other examples, the array of cavities can include two or more LED dies 102 per cavity. In the example of FIG. 1, the grid structure 110 forming the array of cavities can be configured to have a geometry that encloses the electrically conductive lines 103 while surrounding the LED dies 102 such that one LED die is within a cavity, in which the cavity includes a top opening to expose the LED die.

In the example of FIG. 1, the LED lighting device 100 includes an optically reflective coating 105, e.g., such as a TiO$_2$ coating, formed over the electrically conductive lines 103 and/or the electrically conductive conduits 104, exposed areas of the heat sink plate 101, and the walls/surfaces of the cavities. In this exemplary configuration, the LED dies 102 are free of the optically reflective coating 105, allowing the output of emitted LED light to transmit without obstruction. The optically reflective coating 105 provides desired optical reflection to direct light towards the top opening of each cavity, thus improving the overall optical efficiency of the LED lighting device 100.

In the example of FIG. 1, the LED lighting device 100 includes optically transparent plates 106 formed over the LED dies 120 enclosed in the respective cavity, in which each optically transparent plate 106 is placed on a top opening of the respective cavity to be spaced from the LED dies 102 and to allow transmission of light produced by a respective LED die 102 inside the cavity. In some implementations, the LED lighting device 100 includes an optically transparent material 107 filled in the cavity (e.g., in the space between each LED die 102 and the top optically transparent plate 106). The optically transparent material 107 filled in the cavity can be selected to have a refractive index that is close to or matches a refractive index of the optically transparent plate 106 on the top of the cavity to minimize optical loss due to optical reflection or scattering at the interface with the top plate. For example, the optically transparent material 107 filled in the cavity can include clear silicone. In some implementations, the LED lighting device 100 includes one or more phosphor layers 108 are formed on at least some of the optically transparent plates 106 to convert light from respective LED dies 102 into light of desired colors. In some exemplary implementations, the LED lighting device 100 includes a side coating 109 over the exposed side surfaces of the optically transparent plates 106. For example, the side coating 109 can be configured of an optically reflective coating such as a $TiO_2$ coating.

The exemplary design of the LED lighting device 100 separates the phosphors layers 108 from the LED dies 102 by the filled optically transparent material 107 in the cavity and the optically transparent plate 106 on top of the cavity. This spatial separation and a larger phosphor area on plate reduces the LED-generated heat at the phosphors and thus mitigates heat-related adverse effects to the phosphors. In addition, the use of the top optically transparent plates 106 to form, hold and support the phosphors enable better control the phosphor uniformity and amounts. For example, the top optically transparent plates 106 can be formed of glass materials or other materials that have flat surfaces to allow phosphors to be formed with accurately controlled amounts and thickness, e.g., by blade coating or printing processes or other suitable processes.

Figure 2:
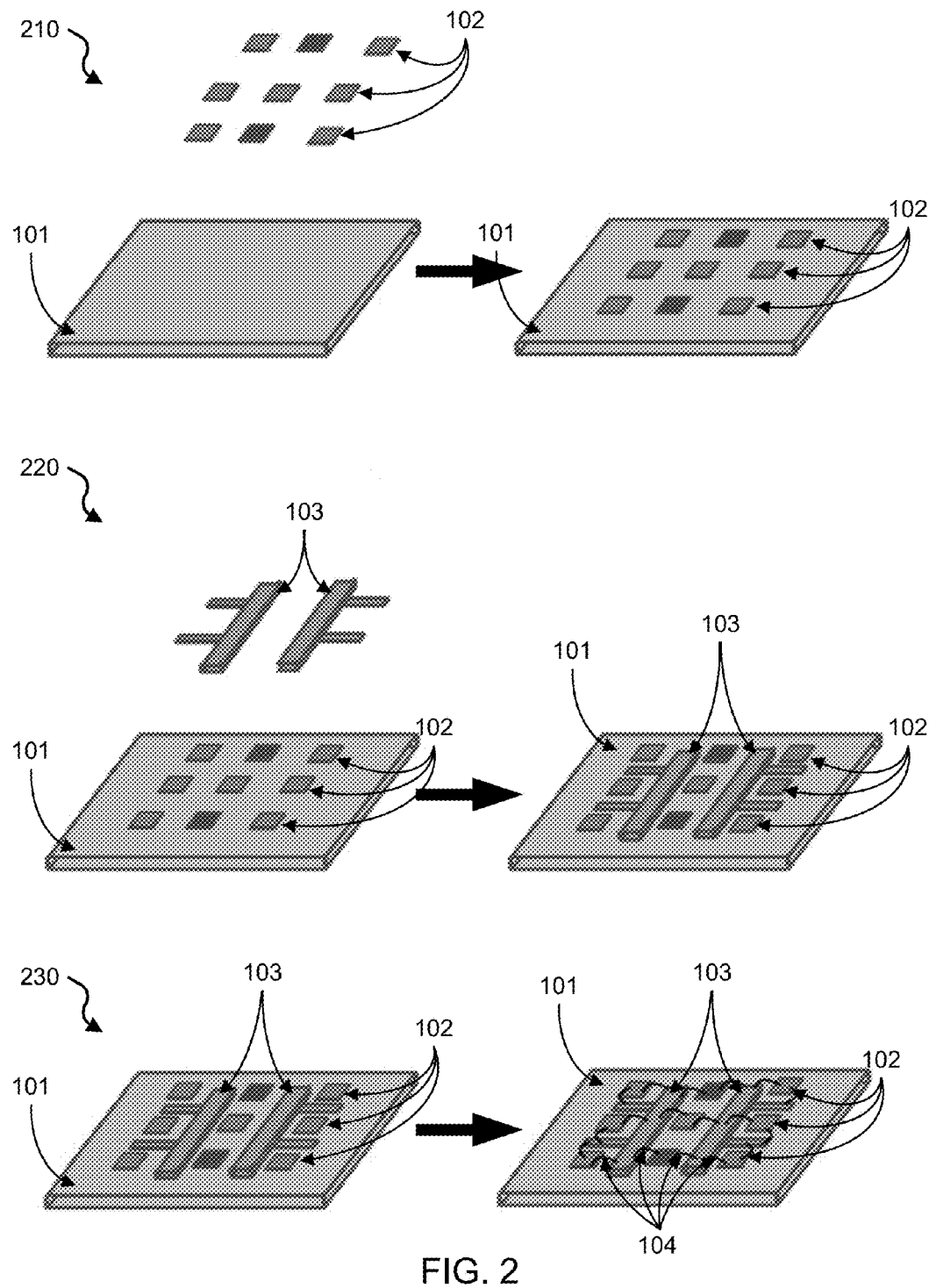
FIG. 2 shows schematic illustrations of processing steps of an exemplary method to fabricate an exemplary LED chip package configuration of the disclosed technology.

FIGS. 2, 3, and 4 show processing schematics depicting an exemplary method for fabrication of the exemplary LED chip package in FIG. 1.

FIG. 2 shows exemplary schematics illustrating three processing steps of the fabrication method. First, the method includes a process 210 to deposit LED dies or chips 102 directly over the heat sink plate 101. For example, the LED dies or chips 102 can be configured for different colors (e.g., blue and red LEDs, among other colors of LEDs). The process 220 is to form the electrically conductive lines or strips 103 on the heat sink plate 101, in which the electrically conductive lines or strips 103 can function as electrical connects for connecting the LED dies 102 to their respective driver circuits, e.g., in properly shaped printed circuit boards such as FR4 PCBs. Next, the method includes a process 230 to form the electrical connections of the electrically conductive conduits 104 between the LED dies 102 over the heat sink plate 101. For example, the process 230 can be implemented using wire bonding techniques to produce the electrically conductive conduits 104 to link the LED dies 102 and the respective electrically conductive connection lines 103. This exemplary LED chip package design allows inexpensive FR4 PCBs to be used without using relatively expensive Metal Core Printed Circuit Boards (MCPCBs).

FIG. 3 shows exemplary schematics illustrating an additional processing step of the fabrication method in FIG. 2. After the process 230, the method can include a process 340 to form the optically reflective coating 105 (e.g., $TiO_2$ coating) over the structures of the LED lighting device 100 except for the LED dies 102. The process 340 can include forming the optically reflective coating 105 by implementing atomic layer deposition (ALD) or other thin film deposition or coating processes.

FIG. 4 shows exemplary schematics illustrating additional processing steps of the fabrication method in FIGS. 2 and 3. After the process 340, the method can include a process 450 to attach the grid structure array of cavities 110 corresponding to the array of LED dies 102 on the optically-reflective heat sink plate 101. In the process 450, the grid structure array of cavities 110 is prepared and/or coated with the optically reflective coating 105 to cover its surfaces and walls. For example, the grid structure array of cavities 110 can be formed of a metal, e.g., such as aluminum, or other materials. The coated grid structure array of cavities 110 is mounted onto the coated heat sink plate 101 where each LED die is placed inside a corresponding cavity. Each cavity formed by the mounting of the grid structure 110 includes a top opening that is above the top of the LED die 102 in the cavity. In some implementations, for example, the process 450 can include a step to fill the cavities with the optically transparent filler material 107, e.g., a clear silicone. After the process 450, the method can include a process 460 to place the optically transparent plates 106, e.g., such as glass pallets, on top of the cavities to close the cavities. In some implementations of the process 460, the optically transparent plates 106 can be placed such that there is one plate per cavity. As illustrated in FIG. 4, for example, the top surfaces of the optically transparent plates 106 may be coated with desired phosphors, e.g., such as applying one or more layers of the phosphors 108, for conversion of LED light into light of desired colors. In some implementations, for example, the phosphors 108 can be mixed with silicone, e.g., with an index of refraction greater than 1.4, and deposited onto the desired optically transparent plates 106 by blade coating or printing.

Figure 5:
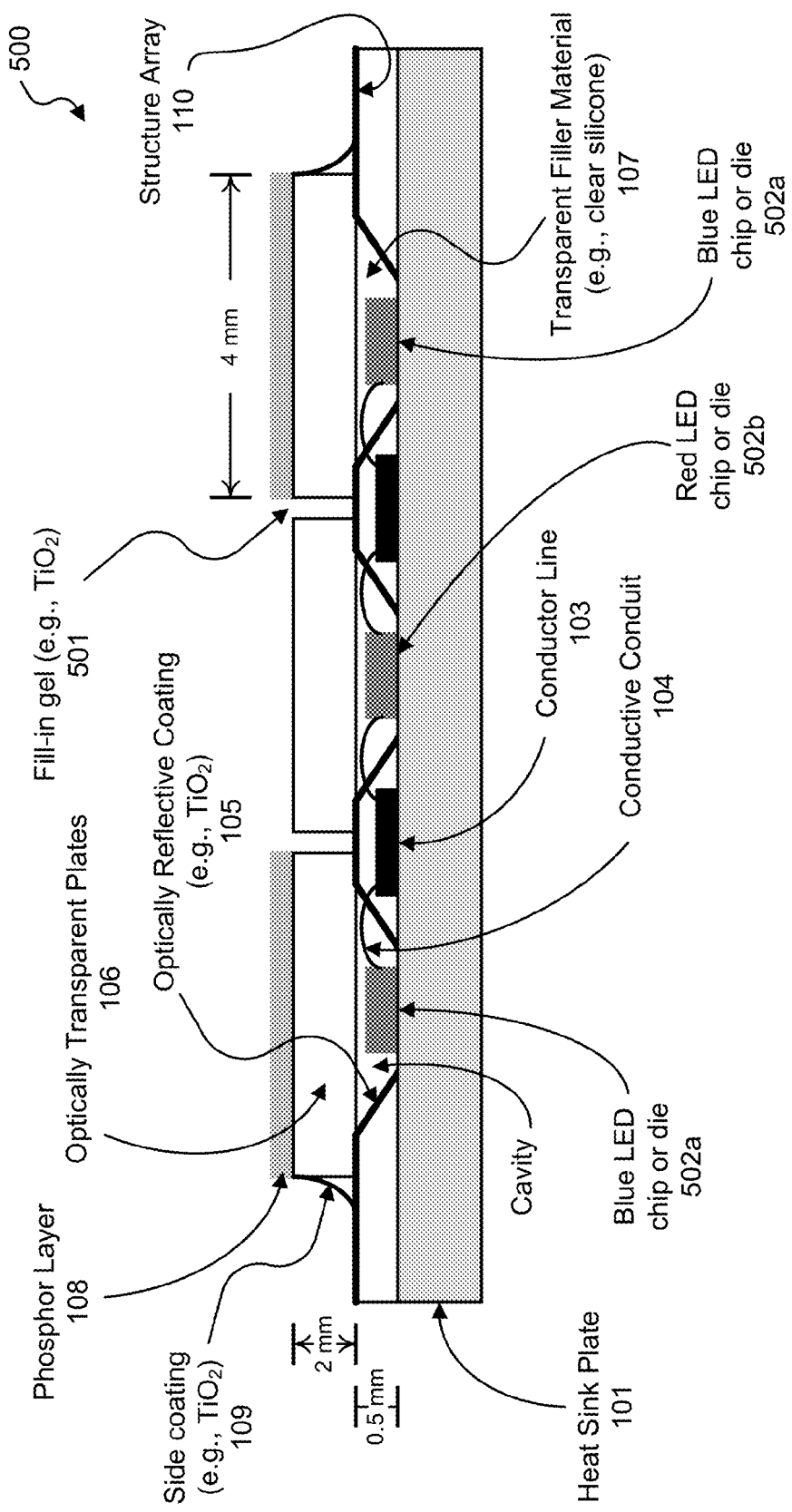
FIG. 5 shows an LED lighting device based on the exemplary multi-LED chip package design with different emission colors based on the fabrication method in FIGS. 2-4.

FIG. 5 shows an LED lighting device 500 based on the exemplary multi-LED chip package design with different emission colors based on the fabrication method shown in FIGS. 2, 3, and 4. The LED lighting device 500 can be structured similar to the LED lighting device 100 in FIG. 1, with some modifications to the optically transparent plates 106 and phosphors 108 to produce desired colored light emissions from the LED lighting device 500. The LED lighting device 500 includes colored lighting elements including blue LED chip or die 502a (e.g., 440 nm to 475 nm) and red LED chip or die 502b (e.g., 610 nm to 635 nm). In this example, the top glass pallets (optically transparent plates 106) over the red LED dies 502b may not be coated with phosphors to produce the red light, and some of the top glass pallets (optically transparent plates 106) over the blue LED dies 502a may be coated with phosphors 108 to produce light of colors other than blue and red colors while some other top glass pallets 106 over the blue LED dies 502a may be clear and not covered by phosphors to produce the blue light.

In the exemplary light-emitting elements package designs described above, the output light from each LED chip and/or die (or LD chip and/or die) and any emitted light from the top phosphors are reflected by the optically reflective coating towards the top opening of each cavity. Therefore, the overall optical efficiency is enhanced.

In the exemplary light-emitting elements package design fabrication processes described above, multiple LED chips can be die-bonded to the substrate, e.g., metal or ceramic, which has good thermal conductivity and similar thermal expansion coefficient as LED chips. For example, thin strips of PCB with electrically conductive lines, e.g., such as FR4, can be attached to the substrate next to these LED chips. The LED chips can be electrically connected to the PCB through wire bonding. Then high optically reflective layer (e.g., >90% reflectivity) can be deposited on the substrate and PCB. A structure having high optically reflective cavities (e.g., >90% reflectivity), such as a metal array structure coated with $TiO_2$) can be put on the substrate. For example, each cavity can have a height that is above the LED chip and bonding wires and surround with LED chip on all sides but have a top opening while also enclosing the PCB strips. In a separate process, phosphors can be deposited on glass plates. For example, this can allow a better control the phosphors through its thickness and/or concentration directly on the glass. For example, the phosphors may be mixed with silicone, e.g., with an index of refraction greater than 1.4, and deposited on to the glass. Only glass pallets with correct color will be used for the lighting device engine. For example, the phosphors-deposited glass pallets can be tested by an LED or laser beam in a separate process to verify the light quality. This will lead to much better color targeting and higher color yield on the LED engine level. Next, the clear silicone filler material can be filled into the high optically reflective cavities and the glass pallets (e.g., some with deposited phosphors and/or some without) can be attached on the top of the respective cavities. For example, good optical contact can be achieved between glass pallets and the silicone filled in the cavity by matching the indices of refraction of the two materials. In some implementations, a high optically reflective gel 501, e.g., such as $TiO_2$ mixed in silicone, can be applied on the side of these glass pallets. In addition to the better color control and color yield of the LED lighting devices using the described glass pallets, another advantage of the exemplary pallets with phosphors and high reflective surroundings includes its higher conversion efficiency compared to depositing phosphors directly to the LED chips. For example, this can be due to the higher reflectivity of the surroundings (e.g., >90%) compared to the blue LED chip itself in visible light.

In some implementations, the exemplary light-emitting elements package design described above can be configured to maintain a high CRI greater than CRI value of 85 or higher.

Figure 6:
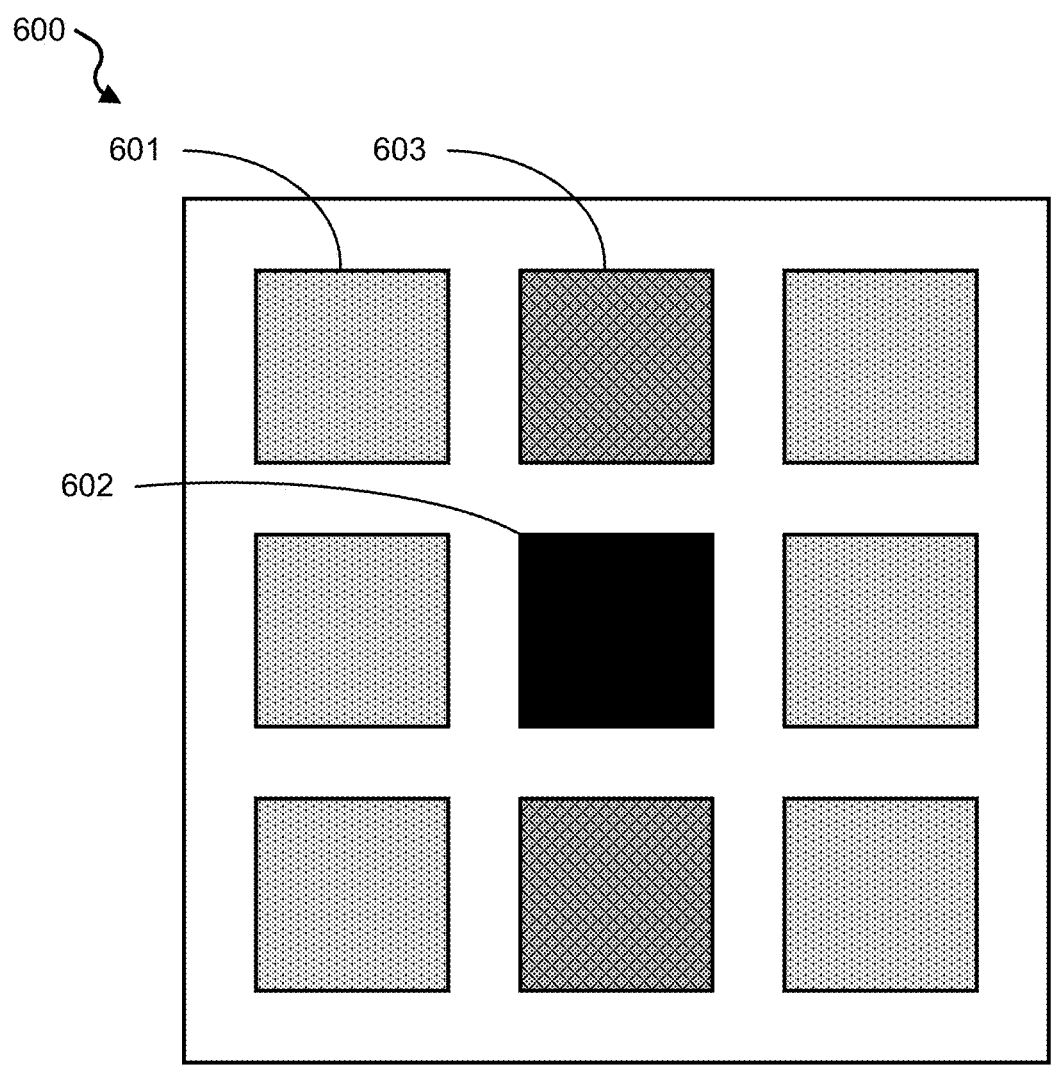
FIG. 6 shows a diagram of a tunable LED lighting device having three types of LED sites emitting three different colors, e.g., red, blue and yellow.

FIG. 6 shows a diagram of a tunable LED lighting device 600 having three types of LED sites emitting different colors. The LED lighting device 600 can be structured similar to the LED lighting device 100 in FIG. 1, with some modifications to provide color distribution and channel control. In this example, the LED lighting device 600 is structured to include three color channels of LEDs with glass pallets having various phosphor configurations. The device 600 includes a channel 601 configured from a blue LED with an over-saturated or a fully-saturated yellow phosphors coating on the glass pallet. The device 600 includes a channel 602 configured from a blue LED (e.g., 440 nm to 475 nm) with a clear glass pallet or no glass pallet formed over the LED chip or die. The device 600 includes a channel 603 configured from a red LED (e.g., 610 nm to 635 nm) with a clear glass pallet or no glass pallet formed over the LED chip or die. The tunable LED lighting device 600 is structured to include a PCB circuit design on the substrate in such a way that, electrically, these three types of LED sites with glass pallets can be driven independently as the three channels 601, 602, and 603. For example, the tunable LED lighting device 600 can include LED driver circuits to respectively drive the LEDs to emit light; a digital controller to control the LED driver circuits in driving the LEDs to emit light; and a memory device to store LED control information for controlling the LEDs. In operation, the digital controller retrieves the stored LED control information to control the LED driver circuits based on the retrieved LED control information to control color or optical power of the LEDs. This exemplary design allows adjustment of colors by controlling individual LEDs. Details of this adjustment are described in the PCT Patent Application document WO 2011/163672, entitled "ADJUSTABLE SOLID STATE ILLUMINATION MODULE HAVING ARRAY OF LIGHT PIXELS", which is incorporated by reference in its entirety as part of the disclosure in this patent document.

The LED packaging designs described herein can be used in LED lighting devices that produce tunable white light on blackbody locus from the warm white colors (e.g., corresponding to a color correlated temperature (CCT) range from 2600 K to 3000 K) to cool white colors (corresponding to a CCT range up to 10000 K). For example, a tunable white light LED lighting device of the disclosed technology can be configured as a four-channel LED engine having (1) yellow light sites including blue LEDs with over-saturated or fully-saturated yellow phosphors coating on the glass pallet, (2) blue light sites with blue LEDs (e.g., 440 nm to 475 nm) with a clear glass pallet or no glass pallet at all, (3) red light sites having red LEDs (e.g., 610 nm to 635 nm) with a clear glass pallet or no glass pallet at all, and (4) green light sites with green LEDs (e.g., 510 nm to 540 nm) with a clear glass pallet or no glass pallet at all. The PCB circuit design on the substrate can be configured in such way that, electrically, these four types of LED lighting sites can be driven independently as four channels. For example, an alternative to the green LEDs, the green light sites can include blue LEDs with green phosphors coated on the corresponding glass pallets.

In some examples, tunable white light emission on blackbody locus from warm white (2600 K to 3000 K) to cool white (up to 10000 K) can be achieved based on the following. An exemplary LED packaging design for an LED lighting device can use fully-saturated yellow phosphors coated LED (e.g., blue or UV) as a foundation building block of flux. The design an combine output adjustable RGB LEDs with the above phosphor-coated LED (pcLED) to obtain the desired CCT (e.g., from 2000 K to 10000 K, for most applications) or even light output outside blackbody for specific mood lighting. For <5000 K CCT, the design can use pcLEDs, e.g., power adjustable blue and red LEDs. For >5000 K CCT, the design can use pcLEDs, e.g., power adjustable blue and green LEDs.

It is understood that the described LED packaging designs and fabrication techniques can also be implemented using LD chips and/or dies.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An LED lighting device, comprising:
a heat sink plate formed of a metal or ceramic material;
LED dies formed on and in direct contact with the heat sink plate;
electrically conductive lines formed between the LED dies, the electrically conductive lines being connected to the LED dies via wire bonding for electrically driving the LED dies to emit light;
an array of cavities formed over the heat sink plate to enclose the LED dies in respective cavities, one LED die per cavity;
an optically reflective coating formed over the electrically conductive lines, exposed areas of the heat sink plate, and surfaces of the cavities while leaving LED dies free of the optically reflective coating;
optically transparent plates formed over the LED dies, respectively, and each optically transparent plate placed on a top opening of a respective cavity to be spaced from the LED dies and to allow transmission of light produced by a respective LED die inside the cavity;
an optically transparent material filled in the cavities underneath the optically transparent plates and having a refractive index that is close to or matches a refractive index of the optically transparent plates; and
phosphor layers formed on at least some of the optically transparent plates to convert light from respective LED dies into light of desired colors.

2. The device as in claim 1, wherein the electrically conductive lines formed between the LED dies and connected to the LED dies via wire bonding are part of printed circuit boards mounted to the heat sink plate.

3. The device as in claim 2, wherein the printed circuit boards are FR4 printed circuit boards.

4. The device as in claim 1, wherein the optically reflective coating has a reflectivity of greater than 90% in the visible spectral range.

5. The device as in claim 1, wherein the optically reflective coating is formed of a white pigment.

6. The device as in claim 1, wherein the optically reflective coating is includes titanium dioxide.

7. The device as in claim 1, wherein the optically transparent material filled in the cavities includes silicone.

8. The device as in claim 1, wherein the array of cavities is formed within a metal grid which is coated with the optically reflective coating.

9. The device as in claim 8, wherein the metal grid is made of aluminum.

10. The device as in claim 1, wherein optically transparent plates are glass plates.

11. The device as in claim 1, wherein the LED dies include LEDs that emit light of different colors.

12. The device as in claim 11, wherein the LEDs include blue LEDs that emit blue light.

13. The device as in claim 11, wherein the LEDs include blue LEDs that emit blue light and red LEDs that emit red light.

14. The device as in claim 11, further comprising:
LED driver circuits that respectively drive the LEDs to emit light;
a digital controller that controls the LED driver circuits in driving the LEDs to emit light; and
a memory device that stores LED control information for controlling the LEDs, wherein the digital controller retrieves the stored LED control information to control the LED driver circuits based on the retrieved LED control information to control color or optical power of the LEDs.

15. The device as in claim 14, wherein the digital controller adjusts an output optical power level of an LED by changing an amount of time electrical power to the LED is turned on.

16. The device as in claim 14, wherein the digital controller adjusts an output optical power level of an LED by changing a magnitude of electrical power that is applied to the LED via a respective driver circuit.

17. The device as in claim 14, further comprising:
a light detection system that includes one or more photo detectors operable to sense different wavelength spectrum of different LEDs.

18. A light-emitting diode (LED) lighting device, comprising:
a substrate capable of dissipating heat, the substrate formed of a metal or ceramic material;
an array of LED dies located on the substrate;
electrically conductive lines on the substrate and electrically connected to the LED dies for electrically driving the LED dies to emit light;
a grid structure over the substrate, the grid structure including top openings and bottom openings and forming an array of cavities to surround the LED dies in respective cavities;
an optically reflective coating at least partially covering one or more of exposed regions of the substrate, the electrically conductive lines, or surfaces of the grid structure, wherein light emitting regions of the LED dies are not covered by the optically reflective coating; and
optically transparent plates placed over at least some of the top openings of the grid structure, wherein one optically transparent plate corresponds to one cavity, the optically transparent plates allowing transmission of light produced by a respective LED die inside a respective cavity.

19. The device as in claim 18, wherein the electrically conductive lines are arranged between the LED dies.

20. The device as in claim 18, wherein the electrically conductive lines are connected to the LED dies via wire bonding.

21. The device as in claim 18, wherein one LED die is contained within each cavity of the grid structure.

22. The device as in claim 18, further comprising an optically transparent material filled in the cavities underneath the optically transparent plates and having a refractive index substantially matching or close to a refractive index of the optically transparent plates.

23. The device as in claim 18, further comprising phosphor layers formed on at least some of the optically transparent plates to convert light from respective LED dies into light of desired colors.

24. The device as in claim 18, wherein the electrically conductive lines are part of printed circuit boards (PCBs) attached to the substrate.

25. The device as in claim 24, wherein the printed circuit boards are FR4 PCBs.

26. The device as in claim 18, wherein the optically reflective coating has a reflectivity of greater than 90% in the visible spectral range.

27. The device as in claim 18, wherein the optically reflective coating is formed of a white pigment.

28. The device as in claim 18, wherein the optically reflective coating is includes titanium dioxide.

29. The device as in claim 22, wherein the optically transparent material filled in the cavities includes silicone.

30. The device as in claim 18, wherein the grid structure is made of a metal.

31. The device as in claim 30, wherein the grid structure is made of aluminum.

32. The device as in claim 18, wherein optically transparent plates include glass pallets.

33. The device as in claim 18, wherein the LED dies include LEDs that emit light of different colors.

34. The device as in claim 33, wherein the LEDs include at least one of blue LEDs that emit blue light or red LEDs that emit red light.

35. The device as in claim 33, further comprising:
LED driver circuits that respectively drive the LEDs to emit light;
a digital controller that controls the LED driver circuits in driving the LEDs to emit light; and
a memory device that stores LED control information for controlling the LEDs,
wherein the digital controller retrieves the stored LED control information to control the LED driver circuits based on the retrieved LED control information to control color or optical power of the LEDs.

36. The device as in claim 35, wherein the digital controller adjusts an output optical power level of an LED by changing an amount of time electrical power to the LED is turned on.

37. The device as in claim 35, wherein the digital controller adjusts an output optical power level of an LED by changing a magnitude of electrical power that is applied to the LED via a respective driver circuit.

38. The device as in claim 35, further comprising:
a light detection system that includes one or more photo detectors operable to sense different wavelength spectrum of different LEDs.

39. The device as in claim 18, wherein the optically transparent plates are detachable from the device.

40. The device as in claim 33, the device structured to include multiple color channels including:
a yellow light site corresponding to a first cavity of the grid structure, the yellow light site including a blue LED and one of an over-saturated or fully-saturated yellow phosphors coating on the corresponding optically transparent plate,
a blue light site corresponding to a second cavity of the grid structure, the blue light site including a blue LED and one of the corresponding optically transparent plate or no optically transparent plate over the second cavity, and
a red light site corresponding to a third cavity of the grid structure, the red light site including a red LED and one of the corresponding optically transparent plate or no optically transparent plate over the third cavity,
wherein the multiple color channels are electrically configured to emit light independently.

41. The device as in claim 40, wherein the device is structured to further include a green light site corresponding to a fourth cavity of the grid structure, the green light site including a green LED and one of the corresponding optically transparent plate or no optically transparent plate over the fourth cavity,
wherein the multiple color channels are electrically configured to emit light independently.

42. A method to fabricate light-emitting diode (LED) lighting device, comprising:
forming LED dies directly over a substrate capable of dissipating heat;
forming electrically conductive lines on the substrate electrically connected to the LED dies, the electrically conductive lines operable for electrically driving the LED dies to emit light;
forming an optically reflective coating to at least partially cover one or more of exposed regions of the substrate or the electrically conductive lines, wherein light emitting regions of the LED dies are not covered by the optically reflective coating;
attaching a grid structure over the substrate to form an array of cavities corresponding to the array of LED dies, wherein the grid structure includes surfaces coated with the optically reflective coating; and
attaching optically transparent plates over at least some of the cavities of the grid structure, wherein one optically transparent plate corresponds to one cavity, the optically transparent plates allowing transmission of light produced by a respective LED die inside a respective cavity.

43. The method as in claim 42, further comprising filling the cavities with an optically transparent material.

44. The method as in claim 42, wherein at least some of the optically transparent plates include a phosphor coating over a top surface.

45. The method as in claim 42, wherein the forming the electrically conductive lines on the substrate electrically connected to the LED dies are connected to the LED dies via wire bonding.

* * * * *